United States Patent
Ishii et al.

(10) Patent No.: US 8,562,896 B2
(45) Date of Patent: Oct. 22, 2013

(54) MICROPATTERN TRANSFER METHOD AND MICROPATTERN TRANSFER DEVICE

(75) Inventors: Satoshi Ishii, Hitachi (JP); Masahiko Ogino, Hitachi (JP); Noritake Shizawa, Ninomiya (JP); Kyoichi Mori, Oiso (JP); Akihiro Miyauchi, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 274 days.

(21) Appl. No.: 12/765,145

(22) Filed: Apr. 22, 2010

(65) Prior Publication Data

US 2010/0270712 A1    Oct. 28, 2010

(30) Foreign Application Priority Data

Apr. 24, 2009   (JP) .................. 2009-105882

(51) Int. Cl.
*B82Y 40/00*    (2011.01)
(52) U.S. Cl.
USPC ....................................... 264/496
(58) Field of Classification Search
CPC .............. B82Y 40/00; G03F 7/0002
USPC ....................................... 264/496
See application file for complete search history.

(56) References Cited

U.S. PATENT DOCUMENTS 5,747,220 A *   5/1998   Hidaka et al. .............. 430/273.1
2006/0249886 A1 * 11/2006   Chao et al. ................. 264/496
2009/0085255 A1    4/2009   Tada et al.

FOREIGN PATENT DOCUMENTS

JP    2007-296783    11/2007
JP    2008-178984    8/2008
JP    2009-83172    4/2009

OTHER PUBLICATIONS

Colburn, M.E.; "Step and Flash Imprint Lithography: A low pressure, room temperature, nanoimprint lithography", University of Texas, Austin; Aug. 2001, particularly pp. 55-61, accessible: http://proquest.umi.com/pqdweb?index=0&did=726000261&SrchMode=2&sid=2&Fmt=6&VInst=PROD&VType=PQD&RQT=309&VName=PQD&TS=1320240617&clientId=19649.*
Communication mailed May 14, 2013, in connection with Japanese Application No. 2009-105882; 2 pages; Japanese Patent Office; Japan.

* cited by examiner

*Primary Examiner* — Yogendra Gupta
*Assistant Examiner* — Alison Hindenlang
(74) *Attorney, Agent, or Firm* — Antonelli, Terry, Stout & Kraus, LLP.

(57) ABSTRACT

An object of the present invention is to provide a micropattern transfer method and a micropattern transfer device in which the small amount of resin is applied to a substrate, and the nonuniformity in thickness is prevented to arise on the obtained pattern forming layer. In order to achieve the above object, the present invention provides a micropattern transfer method in which a micropattern is transferred to a resin by pressing a stamper having the micropattern onto the resin applied to a substrate, including the steps of: applying the resin to a surface of the substrate discretely in order to obtain a plurality of resin islands so that a center portion of each of the resin islands forms a planar thin-film, and a peripheral portion of the resin island rises higher than the center portion.

11 Claims, 5 Drawing Sheets

MICROPATTERN TRANSFER METHOD AND MICROPATTERN TRANSFER DEVICE

CROSS REFERENCE TO RELATED APPLICATION

The present application claims benefit of the filing dates of Japanese Patent Application No. 2009-105882 filed on Apr. 24, 2009 which is incorporated herein by reference.

BACKGROUND OF THE INVENTION

1. Field of the Invention

The present invention relates to a micropattern transfer method and a micropattern transfer device for transferring a micropattern of a stamper to a transferred object.

2. Description of the Related Art

Conventionally, a photolithography technology is frequently used as the technology for processing a fine pattern needed in semiconductor devices, etc. Because, however, the pattern has been shrunk and a required process dimension has been shrunk as small as a light source wave length which is used for an exposure, it becomes difficult to process the fine pattern by the photolithography technology. For this reason, instead of the photolithography technology, an electron beam lithography apparatus which is a kind of a charged particle beam apparatus has been used. A pattern formation method of the electron beam lithography apparatus is different from a pattern formation method of a one-shot exposure method using a light source such as i-line and an excimer laser. That is, an exposure time (drawing time) increases as a number of patterns to be drawn increases. Therefore, a time required for the pattern formation increases in proportion to a degree of integration of a semiconductor integrated circuit, thereby resulting in significant reduction of a throughput.

In order to speed up the formation of patterns using the electron beam lithography apparatus, a technique of electron beam cell projection lithography has been developed, in which a plurality of combined masks having various shapes are irradiated with electron beams en bloc. However, such an electron beam lithography apparatus for use in the electron beam cell projection lithography is necessarily large-sized and high-priced, because a structure of the apparatus becomes more complex, and a mechanism for controlling each position of the masks with a higher accuracy is required.

In contradistinction to the above, a nanoimprint technology is well known as a technology for forming a fine pattern at low cost. In this nanoimprint technology, the fine pattern can be transferred by pressing a stamper having a concavity and convexity (surface configuration) corresponding to a concavity and convexity of the fine pattern (concavity and convexity pattern) to be formed onto, for example, a resin applied to a predetermined substrate. Also, this nanoimprint technology is considered to apply to formation of a memory bit in a mass storage medium, and pattern formation in a semiconductor integrated circuit. For example, substrates for the mass storage medium and the semiconductor integrated circuit can be manufactured by etching a thin film layer portion which is exposed at a concave portion of a pattern forming layer, and a substrate portion which contacts the thin film layer using a convex portion of the pattern forming layer formed by the nanoimprint technology as a mask.

An accuracy of etching at the substrate is affected by a distribution of thickness in a surface direction of a thin film layer. For example, assume a case where a thin film layer of a transferred object has a thickness difference of 50 nm between the maximum and the minimum. If the thin film layer is etched at a depth of 50 nm, a substrate is etched in a portion having a small thickness of the thin film layer. On the other hand, the substrate is not etched in a portion having a large thickness of the thin film layer. This means that, in order to ensure a prescribed accuracy of etching, the thickness of the pattern forming layer formed on a substrate needs to be uniform.

On the other hand, as methods for applying the resin in the nanoimprint technology, a spin coating method and an ink jet method can be considered. However, when the spin coating method is used for the nanoimprint technology, a large amount of resin is consumed, thereby resulting in increase in a process cost and an environmental load.

In contrast, the ink jet method requires a very small amount of resin because the resin in the form of fine droplets can be disposed discretely (in dot-pattern) on the substrate (e.g., see JP 2007-296738 A and JP 2008-178984 A). Therefore, when the ink jet method is used for the nanoimprint technology, the process cost and the environmental load can be decreased.

However, there is a problem that when the stamper is pressed onto the resin applied by the ink jet method, nonuniformity in thickness on the order of nm arises on the pattern forming layer between the substrate and the stamper.

Also, as described above, the pattern forming layer having such nonuniformity in thickness degrades the accuracy of etching.

Therefore, an object of the present invention is to provide a micropattern transfer method and a micropattern transfer device in which the small amount of resin is applied to a substrate, and the nonuniformity in thickness is prevented to arise on the obtained pattern forming layer.

SUMMARY OF THE INVENTION

In order to achieve the above object, the present invention provides a micropattern transfer method in which a micropattern is transferred to a resin by pressing a stamper having the micropattern onto the resin applied to a substrate, including the steps of: applying the resin to a surface of the substrate discretely in order to obtain a plurality of resin islands so that a center portion of each of the resin islands forms a planar thin-film, and a peripheral portion of the resin island rises higher than the center portion.

Also, in order to achieve the above object, the present invention provides a micropattern transfer device in which a micropattern is transferred to a photo-curable resin by pressing a stamper having the micropattern onto the photo-curable resin applied to a substrate, including: a resin applying unit for applying the photo-curable resin to a surface of the substrate discretely in order to obtain a plurality of resin islands so that a center portion of each of the photo-curable resin islands forms a planar thin-film, and a peripheral portion of the photo-curable resin island rises higher than the center portion; a light-emitting unit for emitting light toward the photo-curable resin with the stamper pressed against the photo-curable resin in order to cure the photo-curable resin; and a peeling unit for peeling the stamper from the cured photo-curable resin.

DETAILED DESCRIPTION OF THE PREFERRED EMBODIMENT

Next, referring to FIGS. 1-5, embodiments according to the present invention will be explained in detail. Here, after explaining the micropattern transfer device, the micropattern transfer method will be explained. In addition, note that an up and a down direction shown in FIG. 1 is applied to all descriptions below.

Figure 1:
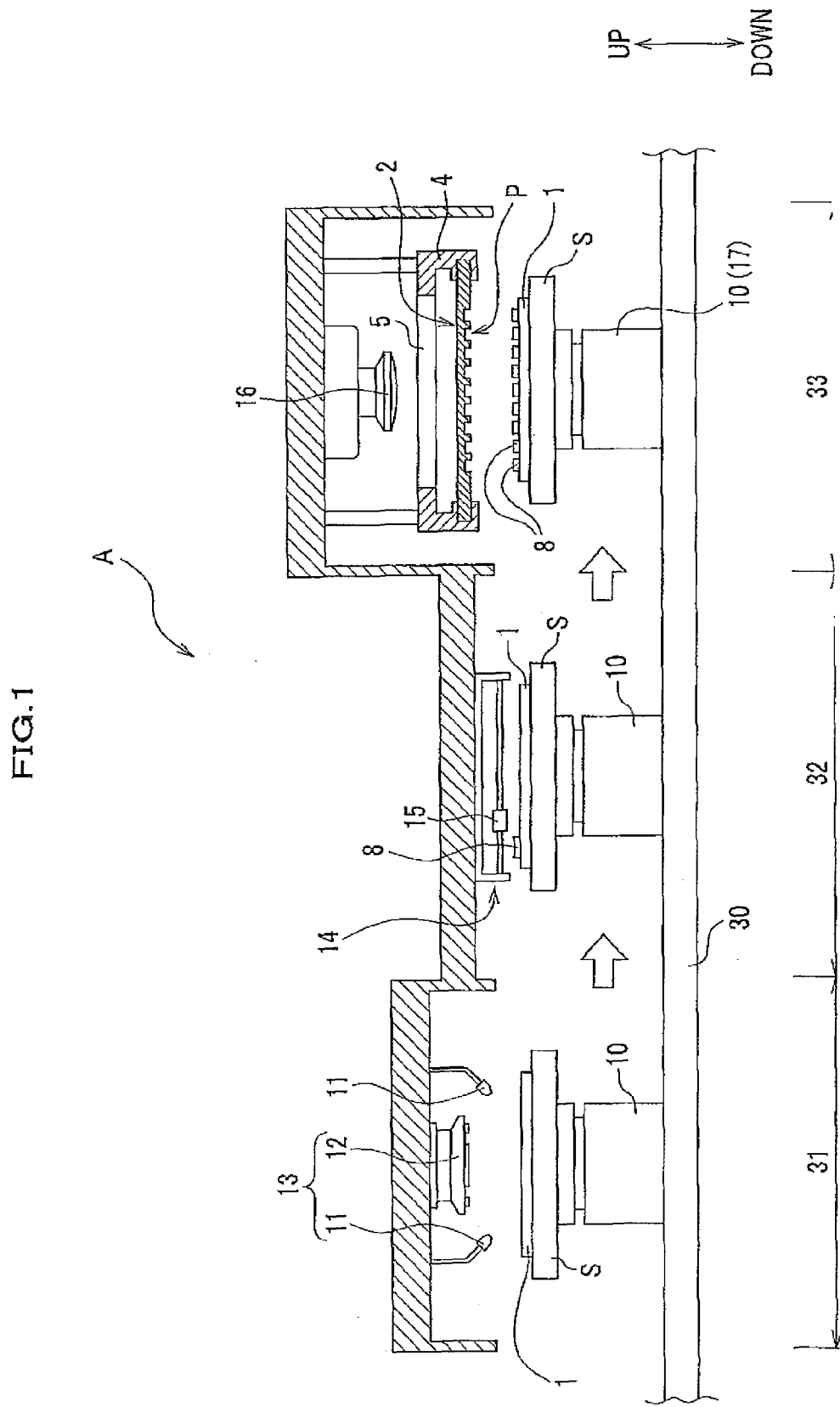
FIG. 1 is a view showing a configuration of a micropattern transfer device of the present invention.

As shown in FIG. 1, a micropattern transfer device A is used for transferring a concavity and convexity pattern P to a photo-curable resin 8 by pressing a stamper 2 having the fine concavity and convexity pattern P onto the photo-curable resin 8 applied to a substrate 1.

In addition, the concavity and convexity pattern P corresponds to a "micropattern" in claims, and is formed on the order of nm or μm. The photo-curable resin 8 corresponds to a "resin" in claims.

The micropattern transfer device A is configured so that a stage S to which a substrate 1 is fixed is horizontally moved to a first area 31, a second area 32, and a third area 33 by a carrying unit 30 (conveyor) in the above described sequence. Also, the stage S is moved up and down by an up-down unit 10 at the first area 31, the second area 32, and the third area 33 respectively.

Although the substrate 1 of this embodiment has a disk shape, the present invention is not limited to this shape. The substrate 1 may have a polygonal, or elliptic shape, etc. Also, the substrate 1 may have a center hole.

The substrate 1 will do as long as it has a tolerance, strength, and workability to the photo-curable resin 8. The substrate 1 is not limited in material and size. As the material of the substrate 1, for example, a metal (e.g., chromium, or copper, etc.), a quartz, a silicon, a glass, or a plastic, etc. can be considered.

The substrate 1 may be a multi layer structure having a metal layer, a resin layer, and an oxide film layer, etc. As the method for fixing the substrate 1 to the stage 5, for example, a mechanical holding, a vacuum adsorption, or an electrostatic chuck, etc. are considered.

At the first area 31 of this micropattern transfer device A, a surface treatment unit 13 for treating a surface of the substrate 1 is provided. As will be explained below, this surface treatment unit 13 treats the surface of the substrate 1 so that a surface tension of the photo-curable resin 8 is equal to or less than 0.8 times a surface energy of the substrate 1.

The surface treatment unit 13 of this embodiment is provided with a nozzle 11 for applying a silane coupler to the surface of the substrate 1, and a drying unit 12 for drying the silane coupler applied to the surface of the substrate 1. In addition, this surface treatment unit 13 may be provided with a washing unit (not shown) for washing the substrate 1 before the silane coupler is applied.

As the silane coupler, for example, the silane coupler having a radical polymerizable (meth)acrylate group, and the silane coupler having a cationic polymerizable vinyl group, etc. can be considered. It is desirable to select the silane coupler according to a polymerizable functional group contained in a photo-curable resin 8 described below.

In addition, the drying unit 12 may perform drying by heating, or vapor, etc.

The surface treatment unit 13 is not limited to the above configuration which applies the silane coupler if the surface energy of the substrate 1 is within the above described range. As described below, the surface treatment unit 13 may form an organic layer on the surface of the substrate 1, or may perform plasma processing on the surface of the substrate 1.

At the second area 32 of the micropattern transfer device A, a resin applying unit 14 is provided. This resin applying unit 14 applies the photo-curable resin 8 to the surface of the substrate 1 treated by the surface treatment unit 13 discretely (in dot-pattern) in order to obtain a plurality of resin islands. More particularly, the resin applying unit 14 applies the photo-curable resin 8 to the substrate 1 so that a diameter of the photo-curable resin 8 is equal to or less than 500 μm in plan view on the substrate 1. It is desirable that this diameter is equal to or more than 300 μm.

The resin applying unit 14 of this embodiment is provided with an ink jet head 15 in order to apply the photo-curable resin 8 to the surface of the substrate 1 using the ink jet method. In this connection, the ink jet head 15 is a non-limiting component if the resin applying unit 14 can apply the photo-curable resin 8 so that a diameter of the photo-curable resin 8 is equal to or less than 500 μm in plan view.

A principal chain of the photo-curable resin 8 is not limited as long as the photo-curable resin 8 is a photo-polymerizable resin having a functional group (polymerizable functional group) which is polymerized by a irradiation (e.g., ultraviolet irradiation). Also, the photo-curable resin may be a resinous compound containing a photo-polymerizable resin monomer, a resinous compound containing a plurality of photo-polymerizable resin monomers, or a resinous compound containing a photo-polymerizable resin and a photo-polymerizable monomer. As a concrete functional group, for example, a vinyl group, an epoxy group, an oxetanyl group, a vinyl ether group, or a (meth)acrylate group can be considered.

A photo-polymerization initiator which the photo-curable resin 8 can contain is appropriately selected according to the polymerizable functional group. As a concrete photo-polymerization initiator, for example, a radical polymerization initiator, and a cationic polymerization initiator, etc can be considered. Especially, the radical polymerization initiator is desirable for speedup in transferring because of a high curing speed. Also, especially, the radical polymerization initiator to initiate curing by ultraviolet rays is desirable because the concavity and convexity pattern P can be formed at room temperatures and a micropattern structure (replica) transferred from the stamper 2 having a finer (more precise) concavity and convexity pattern P can be formed. In addition, the photo-polymerization initiators may by used alone or in combination.

The photo-curable resin 8 may further contain well known polymerization accelerator, and sensitizer, etc. Also, the photo-curable resin 8 may further contain a surfactant to improve an adhesion between the substrate 1 and the photo-curable resin 8, and may contain an additive such as a polymerization inhibitor if necessary.

As described above, the resin applying unit 14 at the second area 32 applies the photo-curable resin 8 discretely (in dot-pattern) so that a center portion of the photo-curable resin 8 forms a planar thin-film, and a peripheral portion of the photo-curable resin 8 rises higher than the center portion.

At the third area 33 of the micropattern transfer device A, the stamper 2 and a light-emitting unit 16 are provided.

The stamper 2 of this embodiment is made of a transparent material such as a quartz, a glass, or a resin, etc. Especially, the quartz and the glass are desirable because they have high transparency, and, as described below, light penetrates them efficiently when the photo-curable resin 8 is irradiated with the light via the stamper 2. Also, one side of the stamper 2 on which the concavity and convexity pattern P is formed may be releasing-treated in order to give a mold releasing property for the photo-curable resin 8.

In addition, unlike this embodiment, when the photo-curable resin 8 is irradiated with the light without the stamper 2, the stamper 2 may be made of a non-transparent material such as a silicon wafer, a metallic material, or a ceramics, etc. As a concrete material, Si, SiC, SiN, polycrystalline Si, Ni, Cr, Cu, and a material containing one or more of Si, SiC, SiN, polycrystalline Si, Ni, Cr, and Cu.

As a method for forming the concavity and convexity pattern P, for example, the photolithography technology, a focused ion beam lithography technology, an electron beam lithography technology, and nanoprint technology can be considered. These technologies can be appropriately selected according to a processing accuracy of the concavity and convexity pattern P.

The stamper 2 of this embodiment is held by a holding jig 4. This holding jig 4 holds an outer edge of the stamper 2 so that the concavity and convexity pattern P is oriented downward, and fixes this stamper 2 to the third area 33. Also, in the holding jig 4, a portion opposite to a back surface of the stamper 2 (i.e., an upper surface in FIG. 1) is made of a transparent body 5.

The light-emitting unit 16 is not limited as long as it can emit light to cure the photo-curable resin. 8, and the kind of the light can be selected appropriate. Especially, a ultraviolet light is desirable, and an ultraviolet lamp for emitting ultraviolet light having wavelength of 365 nm is illustrated. The light-emitting unit 16 is disposed at the opposite side of the stamper 2 via the transparent body 5 of the holding jig 4.

This light-emitting unit 16 emits light in order to cure the photo-curable resin 8 with the stamper 2 pressed against the photo-curable resin 8.

In addition, when the stamper 2 is pressed against the photo-curable resin 8, the stage S is moved upwardly by the up-down unit 10. Although the stamper 2 is pressed against the photo-curable resin 8 by moving the stage S upwardly by the up-down unit 10 in this embodiment, the present invention will do as long as the stamper 2 is relatively pressed against the photo-curable resin 8. Therefore, the stamper 2 may be pressed against the photo-curable resin 8 by moving the stamper 2 downwardly toward the fixed stage S.

At this third area 33, a peeling unit 17 for peeling the stamper 2 from the cured photo-curable resin 8 is further provided. In this embodiment, the peeling unit 17 is composed of the up-down unit 10 to move the stage S downwardly.

Next, the behavior of the micropattern transfer device A according to this embodiment and a micropattern transfer method using this micropattern transfer device A will be explained.

In this micropattern transfer device A, when the stage S is carried to the first area 31 by the carrying unit 30, the surface of the substrate 1 is washed by a washing unit (not shown). As the washing, for example, a washing by a neutral detergent, a washing by an acid solution such as a sulfuric acid solution, a hydrogen peroxide solution, or a mixture thereof, etc., or a washing by an alkaline solution such as an aqua ammonia, or a sodium hydroxide solution, etc., can be considered. Also, a washing process is completed after the substrate 1 is further washed and is dried by the drying unit 12.

Next, in this micropattern transfer device A, the substrate 1 is surface-treated by the surface treatment unit 13. Concretely, after the silane coupler is applied to the surface of the substrate 1 from the nozzle 11, the substrate 1 is dried by the drying unit 12. This process corresponds to a "surface treatment process" in claims. In this process, the surface energy of the substrate is adjusted to be within a predetermined range. In this connection, it is desirable that the surface energy is equal to or more than 1.25 times the surface tension of the photo-curable resin 8. In other words, it is desirable to treat the substrate 1 so that the surface tension of the photo-curable resin 8 is equal to or less than 0.8 times the surface energy of the substrate 1.

Figure 2A:
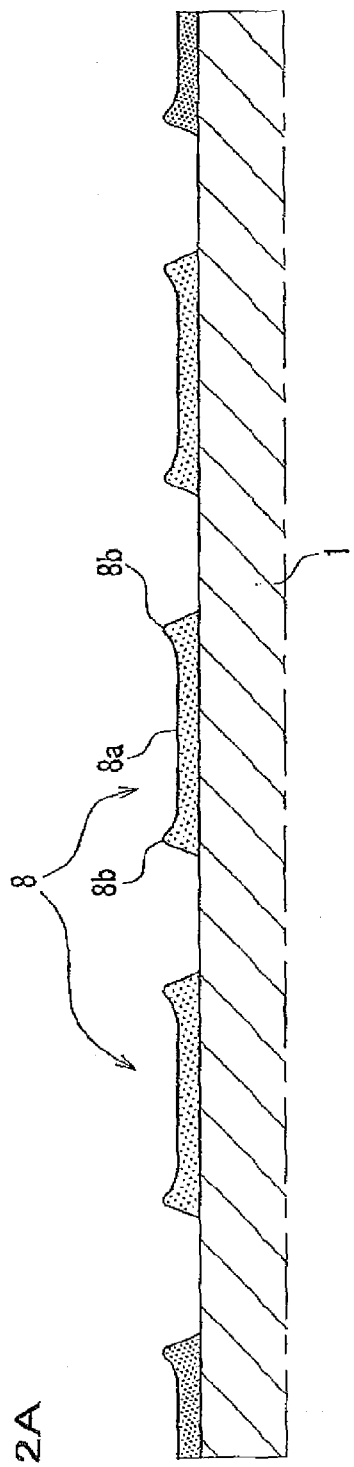
FIG. 2A is a cross-sectional view of a photo-curable resin applied to a substrate using a micropattern transfer method of the present invention.

Next, in this micropattern transfer device A, the stage S is carried from the first area 31 to the second area 32 by the carrying unit 30. Also, a distance between the substrate 1 and the ink jet head 15 is adjusted to a predetermined width by the up-down unit 10. Also, as described above, in the micropattern transfer device A, the resin applying unit 14 applies the photo-curable resin 8 to the surface of the substrate 1 discretely (in dot-pattern) in order to obtain the plurality of resin islands. More particularly, as shown in FIG. 2A, the photo-curable resin 8 is applied to the substrate 1 so that its center portion 8a forms a planar thin-film, and its peripheral portion 8b rises higher than the center portion 8a. This process corresponds to an "resin applying process" in claims. In addition, it is desirable that when the diameter of the photo-curable resin 8 is equal to or more than 300 μm, a thickness of the center portion 8a is equal to or less than 30 nm, and the photo-curable resin 8 covers the surface of the substrate 1 equal to or more than 70%.

Figure 2D:
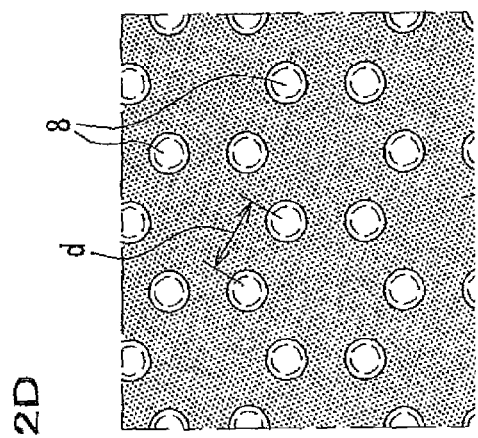
FIGS. 2B-2D are plan views showing locations of the photo-curable resins applied to the substrate using the micropattern transfer method of the present invention.
Figure 2C:
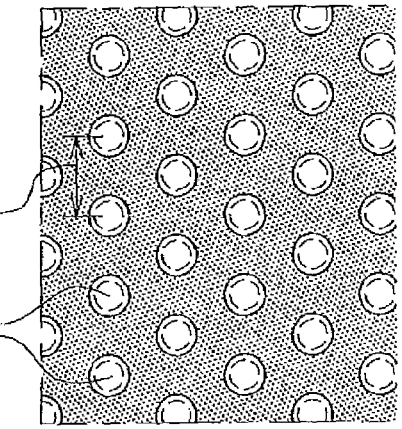
Figure 2B:
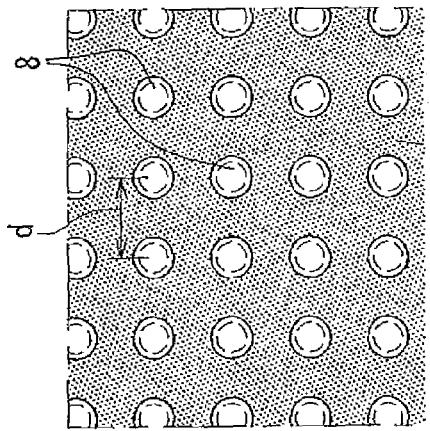

A position of the photo-curable resin 8 applied to the substrate 1 discretely (in dot-pattern) may be a vertex of a rectangle as shown in FIG. 2B, or may be a vertex of an equilateral triangle as shown in FIG. 2C, or may be a vertex of an equilateral hexagon as shown in FIG. 2D. In this connection, it is desirable that a space d between each of the photo-curable resins 8 shown in FIGS. 2B-2D is 300-500 μm.

Figure 3A:
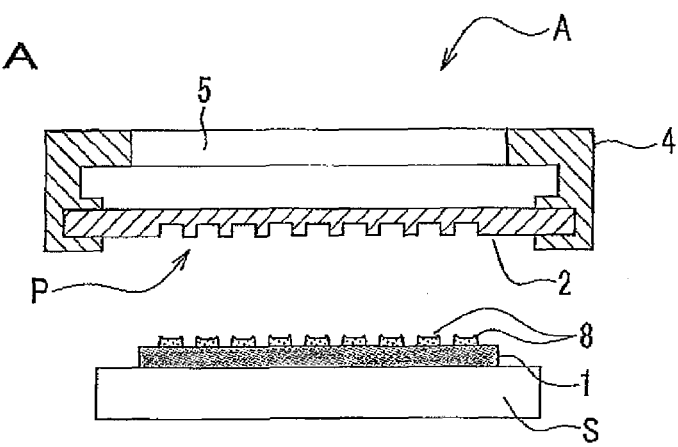
FIGS. 3A-3D are views for explaining steps of a micropattern transfer method of the present invention.

Next, in this micropattern transfer device A, the stage S is carried from the second area 32 to the third area 33 by the carrying unit 30. That is, as shown in FIG. 3A, the photo-curable resin 8 applied to the substrate 1 is opposite to the concavity and convexity pattern P of the stamper 2 held by the holding jig 4. In addition, the transparent body is denoted by "5" and the stage is denoted by "S" in FIG. 3A.

Figure 3B:
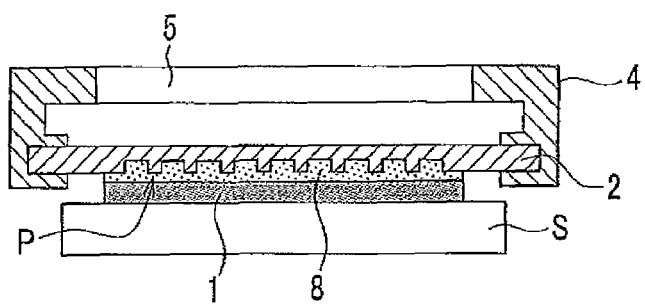

Next, as shown in FIG. 3B, when the stage S is moved upwardly in order to press the stamper 2 against the substrate 1, the dropped photo-curable resin 8 is spread across the surface of the substrate 1, and is filled into the concavity and convexity pattern P of the stamper 2.

Figure 3C:
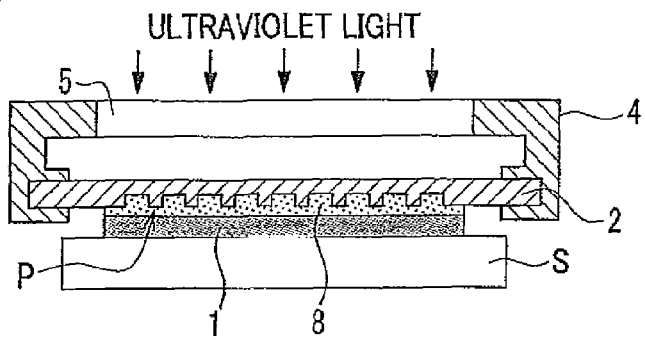

Also, as shown in FIG. 3C, when the photo-curable resin 8 is irradiated with the ultraviolet light via the transparent body 5 of the holding jig 4 and the stamper 2, the photo-curable resin 8 is cured. This process corresponds to a "irradiating process" in claims.

Figure 3D:
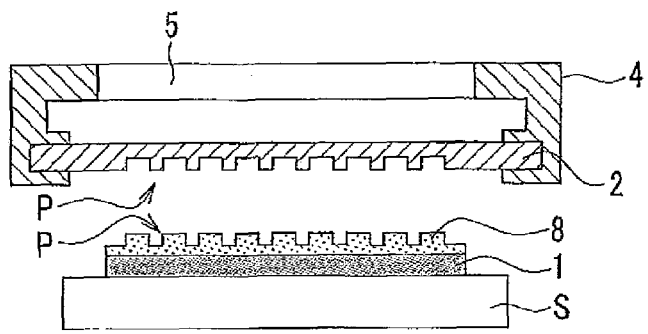

As shown in FIG. 3D, when the stage S is moved downwardly in order to peel the substrate 1 from the stamper 2, the fine concavity and convexity pattern P is transferred to a layer composed of the cured photo-curable resin 8 (a pattern forming layer) and the micropattern is obtained on the surface of the substrate 1. This process corresponds to a "peeling process" in claims.

Next, an operation and effect of the micropattern transfer device A and micropattern transfer method according to the present invention will be explained. In addition, in FIGS. 4A and 4B referred to herein, the concavity and convexity pattern formed on the stamper is omitted for the sake of drawing.

Figure 4A:
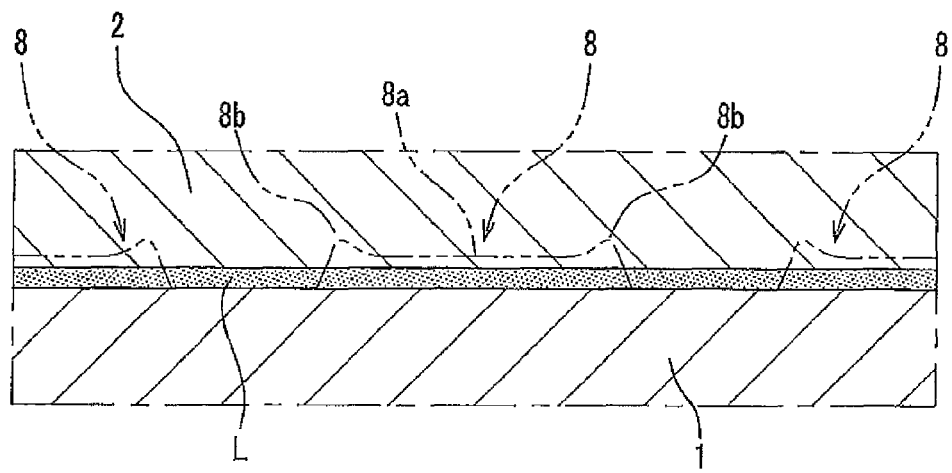
FIG. 4A is a cross-sectional view showing a pattern forming layer formed between the substrate and the stamper using the micropattern transfer method of the present invention.
Figure 4B:
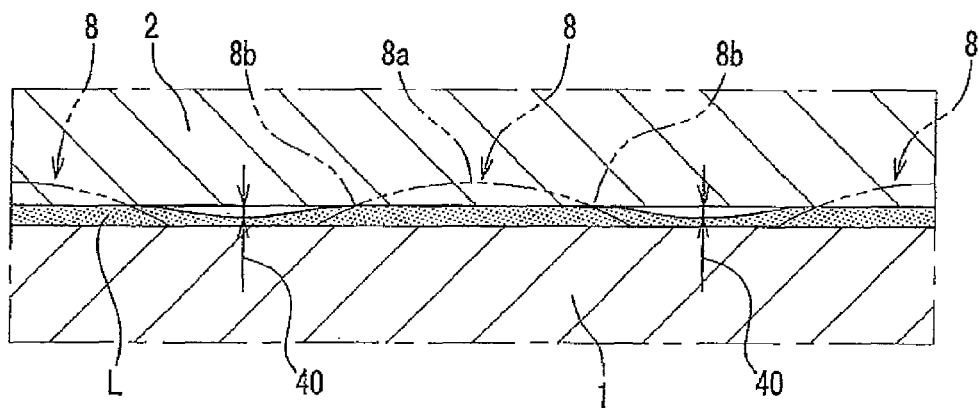
FIG. 4B is a cross-sectional view showing a pattern forming layer formed between the substrate and the stamper using a micropattern transfer method of a comparative example (prior art)

As shown in FIG. 4B, when the photo-curable resin 8 is applied to the substrate 1 discretely (in dot-pattern) using a prior art ink jet method (e.g., see JP 2007-296738 A and JP 2008-178984 A), a center portion 8a of the photo-curable resin 8 rises to form a plano-convex lens shape whose thickness is diminished in the direction toward a peripheral portion 8b of the photo-curable resin 8.

According to such an ink jet method, as described above, because the resin in the form of fine droplets can be disposed on the substrate discretely (in dot-pattern), a very small quantity of the photo-curable resin 8 is required compared to, for example, that used in the spin coating method or a dispensing method. Therefore, it is possible to decrease the process cost and the environmental load when the ink jet method is used for the nanoimprint technology.

As shown in FIG. 4B, however, when the stamper 2 is pressed onto the photo-curable resin 8 applied discretely to form the plano-convex lens shape, a thin portion 40 is formed between the plano-convex lens shape photo-curable resins 8 on a pattern forming layer L formed between the stamper 2 and the substrate 1 by a flow resistance of the photo-curable resin 8 to be spread from the center portion 8a toward the periphery. That is, when the photo-curable resin 8 is applied using the prior art ink jet method (e.g., see JP 2007-296738 A and JP 2008-178984 A), the plurality of thin portions 40 are formed, thereby resulting in an nonuniformity in thickness on the order of nm on the pattern forming layer L.

In contrast, according to the micropattern transfer device A and the micropattern transfer method of this embodiment, as shown in FIG. 4A, the photo-curable resin 8 applied on the substrate 1 by the resin applying unit 14 (resin applying process) has the center portion 8a which forms the planar thin-film, and the peripheral portion 8b which rises higher than the center portion 8a.

For this reason, as shown in FIG. 4A, when the stamper 2 is pressed onto the photo-curable resin 8, the photo-curable resin 8, which is spread from the peripheral portion 8b toward the periphery, has a smaller flow resistance than that of the plano-convex lens shape photo-curable resin 8 (see FIG. 4B).

Therefore, according to the micropattern transfer device A and the micropattern transfer method of this embodiment, as shown in FIG. 4A, it is possible to prevent the nonuniformity in thickness occurring on the pattern forming layer L formed between the stamper 2 and the substrate 1.

That is, according to the micropattern transfer device A and the micropattern transfer method of this embodiment, the pattern forming layer L having an uniform thickness can be formed on the substrate 1, and a required amount of the photo-curable resin becomes small by using the ink jet method, thereby resulting in decrease in the process cost and the environmental load.

Although the embodiment of the present invention has been described, the present invention is not limited to the embodiment, and any other modifications are possible.

Figure 5:
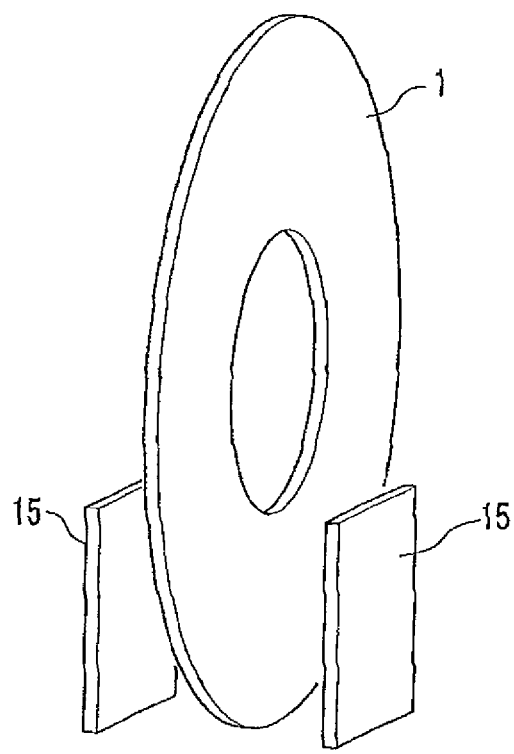
FIG. 5 is a conceptual diagram schematically showing positions of the substrate and ink jet heads in other embodiment.

Although the micropattern transfer device A having the ink jet head 15 for applying the photo-curable resin 8 on one side of the horizontally mounted disk shape substrate 1 has been described, the ink jet heads 15 may be provided on both sides of a longitudinally mounted ring shape substrate 1 as shown in FIG. 5.

Also, although the surface treatment unit 13 of the micropattern transfer device A applies the silane coupler on the substrate 1 in the above described embodiment, a configuration of the surface treatment unit 13 is not limited as long as the surface energy of the substrate 1 is adjusted as described above. For example, the surface of the substrate 1 may be plasma-treated, or an organic layer may be formed on the substrate 1.

Also, although the outer edge of the stamper 2 is mechanically held by the holding jig 4 in the micropattern transfer device A of the above described embodiment, the stamper 2 may be held by other means such as the vacuum adsorption, etc. in the present invention.

Also, in the micropattern transfer device A according to the above described embodiment, the stamper 2 may be further provided with a sensor such as a load cell to detect a load caused by pressing the stamper 2 onto the substrate 1, or an optical sensor to detect a horizontal height of the stamper 2 in order to control a pressure force of the stamper 2.

Also, the micropattern transfer device A according to the above described embodiment may be further provided with a stamper manufacturing unit (not shown) for manufacturing the stamper 2.

As described above, the micropattern structure to which the fine concavity and convexity pattern P is transferred by the micropattern transfer device A can be applied to an information recording medium such as a magnetic recording medium, or an optical recording medium, etc. Also, this micropattern structure can be applied to a large scale integrated circuit, optical elements such as a lens, a polarizing plate, a wavelength filter, light emitting element, and an integrated optics, etc. and biotechnological devices for immune analysis, DNA separation, and cell culture, etc.

EXAMPLES

Next, although the present invention will be explained more specifically with reference to the following examples, the present invention is not limited to these examples.

Example 1

In this example 1, a glass plate whose surface is treated by a silane coupler (Shin-Etsu Silicones Co., Ltd. KBM5130) having an acrylate group is prepared as the substrate. This process corresponds to the surface treatment process. This surface treatment process is implemented by the surface treatment unit 13 in the micropattern transfer device A shown in FIG. 1.

In addition, a surface energy of the glass plate before the surface treatment is performed is $37.4*10^{-5}$ (N/cm), and a surface energy of the glass plate after the surface treatment is performed is $53.1*10^{-5}$ (N/cm).

Next, as shown in FIG. 2A, the photo-curable resin 8 composed of conjugated photo-curable acrylic monomer is applied to a surface-treated substrate 1 using the ink jet method. The photo-curable resin 8 applied to the substrate 1 has the center portion 8a which forms a planar thin-film, and the peripheral portion 8b which rises higher than the center portion 8a. In addition, a piezo head having 512 nozzles (256 nozzles*2 rows) is used in the ink jet method. This process corresponds to the resin applying process. This resin applying process is implemented by the resin applying unit 14 in the micropattern transfer device A shown in FIG. 1.

The surface tension of the photo-curable resin 8 is 41.8*10$^{-5}$ (N/cm). That is, the surface tension of the photo-curable resin 8 shown in FIG. 2A is equal to or less than 0.8 times the surface energy of the substrate 1. Also, a dropped amount of the photo-curable resin 8 using the ink jet method is 4 pL, and a position of the photo-curable resin 8 is a vertex of a rectangle as shown in FIG. 2B. A space d between the photo-curable resins 8 is 350 μm.

The diameter of the photo-curable resin 8 is 350 μm in plan view, and an area ratio of the photo-curable resin 8 on the substrate 1 is 72%. Also, a thickness of the center portion 8a of the photo-curable resin 8 is 30 nm, and a thickness of the peripheral portion 8b is 40 nm. In addition, the above described size of the photo-curable resin 8 is obtained by measuring the cured photo-curable resin 8 using a laser microscope and a step profiler.

Next, as shown in FIG. 3C, the photo-curable resin 8 applied to the substrate 1 (see FIG. 2B) is irradiated with an ultraviolet light with the resin stamper 2 having the fine concavity and convexity pattern P pressed against the photo-curable resin 8 in order to cure the photo-curable resin 8. This process corresponds to the irradiating process. This irradiating process is implemented by the light-emitting unit 16 in the micropattern transfer device A shown in FIG. 1.

In addition, the concavity and convexity pattern P of the stamper 2 is a groove pattern which has 50 nm width, and 80 nm depth, and concentrically continues with 100 nm pitch.

Next, as shown in FIG. 3D, a micropattern structure in which the concavity and convexity pattern P is formed on the pattern forming layer composed of the photo-curable resin 8 on the substrate 1 can be obtained by peeling the stamper 2 from the cured photo-curable resin 8. This process corresponds to the peeling process. This peeling process is implemented by the peeling unit 17 in the micropattern transfer device A shown in FIG. 1.

Also, with respect to the obtained micropattern structure, a transferring accuracy and a transferring status of the concavity and convexity pattern P are evaluated. With respect to the transferring accuracy, a maximum dimensional-error in height is on the order of only 3%. Also, with respect to the transferring status, a thickness of a residual film (the photo-curable resin 8 between a bottom of the concave portion of the concavity and convexity pattern P and the substrate 1, and the same shall apply hereinafter) is on the order of 5 nm, and a difference between a maximum thickness and a minimum thickness of the residual film (hereinafter, the difference is referred to as a maximum difference) is on the order of 1 nm. That is, in this example, nonuniformity in thickness is not formed, and an uniform pattern forming layer L (see FIG. 4A) can be manufactured.

In addition, the transferring accuracy and the transferring status are evaluated using an AFM (atomic force microscope), the laser microscope, and an OSA (optic spectrum analyzer).

Example 2

In this example 2, a glass plate whose surface is treated by an oxygen plasma is prepared as the substrate. This process corresponds to the surface treatment process.

In addition, the surface energy of this substrate is 68.3*10$^{-5}$ (N/cm).

Next, as shown in FIG. 2A, by using the same ink jet method and resin (surface tension 41.8*10$^{-5}$ (N/cm)) as those of example 1, the photo-curable resin 8 is applied to the substrate 1 discretely in order to obtain a plurality of resin islands so that a center portion 8a of each of the resin islands forms a planar thin-film, and a peripheral portion 8b of the resin island rises higher than the center portion 8a. In this connection, the surface tension of the photo-curable resin 8 is equal to or less than 0.8 times the surface energy of the substrate 1.

The space d between the photo-curable resins 8 shown in FIG. 2B is 350 μm the diameter of the photo-curable resin 8 in plan view is 350 μm, and the area ratio of the photo-curable resin 8 on the substrate 1 is 79%. Also, the thickness of the center portion 8a of the photo-curable resin 8 is 25 nm, and the thickness of the peripheral portion 8b is 30 nm.

Next, like example 1, the micropattern structure is obtained on the substrate 1 by pressing the stamper 2 (see FIG. 3B) against the photo-curable resin 8 applied to the substrate 1 (see FIG. 2B), and performing the irradiating process and the peeling process.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 5 nm, and the maximum difference is on the order of 1 nm. That is, in this example, nonuniformity in thickness is not formed, and the uniform pattern forming layer L (see FIG. 4A) can be manufactured.

Example 3

In this example 3, the same grass plate as that of example 1 is prepared as the substrate. That is, the surface energy of the substrate is 53.1*10$^{-5}$ (N/cm).

Next, as shown in FIG. 2A, by using the same ink jet method and resin (the surface tension is 41.8*10$^{-5}$ (N/cm)) as those of example 1, the photo-curable resin 8 is applied to the substrate 1 discretely in order to obtain a plurality of resin islands so that a center portion 8a of each of the resin islands forms a planar thin-film, and a peripheral portion 8b of the resin island rises higher than the center portion 8a. In this connection, the surface tension of the photo-curable resin 8 is equal to or less than 0.8 times the surface energy of the substrate 1.

The space d between the photo-curable resins 8 shown in FIG. 2B is 350 μm, the diameter of the photo-curable resin 8 in plan view is 350 μm, and the area ratio of the photo-curable resin 8 on the substrate 1 is 75%. Also, the thickness of the center portion 8a of the photo-curable resin 8 is 30 nm, and the thickness of the peripheral portion 8b is 40 nm.

Next, like example 1, the micropattern structure is obtained on the substrate 1 by pressing the stamper 2 (see FIG. 3B) against the photo-curable resin 8 applied to the substrate 1 (see FIG. 2B), and performing the irradiating process and the peeling process. However, in this example 3, note that a quartz stamper 2 is used instead of the resin stamper 2 used in example 1.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 5 nm, and the maximum difference is on the order of 1 nm. That is, in this example, nonuniformity in thickness is not formed, and the uniform pattern forming layer L (see FIG. 4A) can be manufactured.

Example 4

In this example 4, the same grass plate as that of example 1 is prepared as the substrate. That is, the surface energy of the substrate is 53.1*10$^{-5}$ (N/cm).

Next, as shown in FIG. 2A, by using the same ink jet method and resin (surface tension $41.8*10^{-5}$ (N/cm)) as those of example 1, the photo-curable resin 8 is applied to the substrate 1 discretely in order to obtain a plurality of resin islands so that a center portion 8a of each of the resin islands forms a planar thin-film, and a peripheral portion 8b of the resin island rises higher than the center portion 8a. However, note that the position of the photo-curable resin 8 is the vertex of the equilateral triangle as shown in FIG. 2C. In this connection, the surface tension of the photo-curable resin 8 is equal to or less than 0.8 times the surface energy of the substrate 1. The space d between the photo-curable resins 8 is 350 μm. The diameter of the photo-curable resin 8 in plan view is 350 μm, and the area ratio of the photo-curable resin 8 on the substrate 1 is 78%. Also, the thickness of the center portion 8a of the photo-curable resin 8 is 30 nm, and the thickness of the peripheral portion 8b is 40 nm.

Next, like example 1, the micropattern structure is obtained on the substrate 1 by pressing the stamper 2 (see FIG. 3B) against the photo-curable resin 8 applied to the substrate 1 (see FIG. 2B), and performing the irradiating process and the peeling process.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 5 nm, and the maximum difference is on the order of 1 nm. That is, in this example, nonuniformity in thickness is not formed, and the uniform pattern forming layer L (see FIG. 4A) can be manufactured.

Example 5

In this example 5, the same grass plate as that of example 1 is prepared as the substrate. That is, the surface energy of the substrate is $53.1*10^{-5}$ (N/cm).

Next, as shown in FIG. 2A, by using the same ink jet method and resin (surface tension $41.8*10^{-5}$ (N/cm)) as those of example 1, the photo-curable resin 8 is applied to the substrate 1 discretely in order to obtain a plurality of resin islands so that a center portion 8a of each of the resin islands forms a planar thin-film, and a peripheral portion 8b of the resin island rises higher than the center portion 8a. However, note that the position of the photo-curable resin 8 is the vertex of the equilateral hexagon as shown in FIG. 2D. In this connection, the surface tension of the photo-curable resin 8 is equal to or less than 0.8 times the surface energy of the substrate 1. The space d between the photo-curable resins 8 is 350 μm.

The diameter of the photo-curable resin 8 in plan view is 350 μm, and the area ratio of the photo-curable resin 8 on the substrate 1 is 72%. Also, the thickness of the center portion 8a of the photo-curable resin 8 is 30 nm, and the thickness of the peripheral portion 8b is 40 nm.

Next, like example 1, the micropattern structure is obtained on the substrate 1 by pressing the stamper 2 (see FIG. 3B) against the photo-curable resin 8 applied to the substrate 1 (see FIG. 2B), and performing the irradiating process and the peeling process.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 5 nm, and the maximum difference is on the order of 1 nm. That is, in this example, nonuniformity in thickness is not formed, and the uniform pattern forming layer L (see FIG. 4A) can be manufactured.

Comparative Example 1

In this comparative example 1, a glass plate whose surface is treated by a release agent having a perfluoroalkyl group (Daikin Industries, Ltd. OPTOOL DSX) is prepared as the substrate.

In addition, the surface energy of this substrate is $13.7*10^{-5}$ (N/cm).

Next, the resin is dropped on the substrate using the same ink jet method and resin (surface tension $41.8*10^{-5}$ (N/cm)) as those of example 1. That is, the surface tension of the photo-curable resin 8 is greater than 0.8 times the surface energy of the substrate 1.

As a result, as shown by phantom lines in FIG. 4B, the center portion 8a of the photo-curable resin 8 forms the plano-convex lens shape whose thickness is on the order of 10 μm, and diameter is 30 μm in plan view.

Next, like example 1, the micropattern structure is obtained on the substrate 1 by pressing the stamper 2 (see FIG. 3B) against the photo-curable resin 8 applied to the substrate 1, and performing the irradiating process and the peeling process.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 20 nm, and significant nonuniformity in thickness is formed on the pattern forming layer L (see FIG. 4B).

Comparative Example 2

In this comparative example 2, a glass plate whose surface is not surface-treated is prepared as the substrate.

In addition, the surface energy of this substrate is $37.4*10^{-5}$ (N/cm).

Next, the resin is dropped on the substrate using the same ink jet method and resin (surface tension $41.8*10^{-5}$ (N/cm)) as those of example 1. That is, the surface tension of the photo-curable resin 8 is greater than 0.8 times the surface energy of the substrate 1. As a result, as shown by phantom lines in FIG. 4B, the center portion 8a of the photo-curable resin 8 forms the plano-convex lens shape whose thickness is on the order of 4 μm, and diameter is 60 μm in plan view.

Next, like example 1, the micropattern structure is obtained on the substrate 1 by pressing the stamper 2 (see FIG. 3B) against the photo-curable resin 8 applied to the substrate 1, and performing the irradiating process and the peeling process.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 20 nm, and significant nonuniformity in thickness is formed on the pattern forming layer L (see FIG. 4B).

Comparative Example 3

In this comparative example 3, the same grass plate as that of example 1 is prepared as the substrate. That is, the surface energy of the substrate is $53.1*10^{-5}$ (N/cm).

Next, the same resin as that of example 1 (the surface tension is $41.8*10^{-5}$ (N/cm)) is used, and this resin is applied to the substrate by the dispensing method. As a result, as shown by phantom lines in FIG. 4B, the center portion 8a of the photo-curable resin 8 forms the plano-convex lens shape whose thickness is on the order of 10 μm, and diameter is 2000 μm in plan view.

Next, like example 1, the micropattern structure is obtained on the substrate 1 by pressing the stamper 2 (see FIG. 3B) against the photo-curable resin 8 applied to the substrate 1, and performing the irradiating process and the peeling process.

Also, like example 1, with respect to the obtained micropattern structure, the transferring accuracy and the transferring status of the concavity and convexity pattern P are evaluated. With respect to the transferring accuracy, the maximum dimensional-error in height is on the order of only 3%. Also, with respect to the transferring status, the thickness of the residual film is on the order of 50 nm, and the maximum difference is on the order of 25 nm. That is, significant nonuniformity in thickness is formed on the pattern forming layer L (see FIG. 4B).

Example 6

In this example 6, as shown in FIG. 5, except that the substrate 1 has a disk shape, a surface-treated glass substrate 1 is used like example 1. In addition, both sides of the substrate 1 is surface-treated. That is, the surface energy on both sides of the substrate 1 is $53.1*10^{-5}$ (N/cm).

Also, the substrate 1 is disposed vertically, and the ink jet heads 15 having 512 piezo nozzles (256 nozzles*2 rows) are disposed over both sides of the substrate 1 respectively.

Next, as shown in FIG. 2A, by discharging the same photo-curable resin as that of example 1 from the ink jet head 15 with the substrate 1 being rotated about its axis, the photo-curable resin 8 is applied to both sides of the substrate 1 discretely in order to obtain a plurality of resin islands so that a center portion 8a of each of the resin islands forms a planar thin-film, and a peripheral portion 8b of the resin island rises higher than the center portion 8a.

In addition, the surface tension of the photo-curable resin 8 is $41.8*10^{-5}$ (N/cm). That is, the surface tension of the photo-curable resin 8 is equal to or less than 0.8 times the surface energy of the substrate 1. Also, a dropped amount of the photo-curable resin 8 using the ink jet method is 4 pL, and a position of the photo-curable resin 8 is a vertex of a rectangle as shown in FIG. 2B. A space d between the photo-curable resins 8 is 350 μm.

The diameter of the photo-curable resin 8 is 350 μm in plan view, and an area ratio of the photo-curable resin 8 on the substrate 1 is 72%. Also, a thickness of the center portion 8a of the photo-curable resin 8 is 30 nm, and a thickness of the peripheral portion 8b is 40 nm. In addition, the above described size of the photo-curable resin 8 is obtained by measuring the cured photo-curable resin 8 using a laser microscope and a step profiler.

Next, although not shown, the photo-curable resin 8 is irradiated with the ultraviolet light with the resin stamper 2 having the same concavity and convexity pattern P as that of example 1 pressed against both sides of the substrate 1 in order to cure the photo-curable resin 8. Also, the micropattern structure in which the concavity and convexity patterns are formed on both sides of the substrate 1 can be obtained by peeling the stamper 2 from the cured photo-curable resin 8.

Also, like example 1, with respect to the obtained micropattern structure, the transferring accuracy and the transferring status of the concavity and convexity pattern are evaluated. With respect to the transferring accuracy, the maximum dimensional-error in height is on the order of only 3%. Also, with respect to the transferring status, the thickness of the residual film is on the order of 5 nm, and the maximum difference is on the order of 1 nm. That is, in this example, nonuniformity in thickness is not formed, and the uniform pattern forming layer L (see FIG. 4A) can be manufactured.

What is claimed is:

1. A micropattern transfer method wherein a micropattern is transferred to a resin by pressing a stamper having the micropattern onto the resin applied to a substrate, comprising the steps of:
    applying the resin to a surface of the substrate discretely in order to obtain a plurality of resin islands, each resin island of the plurality of resin islands having a center portion and a peripheral portion, the center portion of each resin island of the plurality of resin islands forms a planar thin-film, and the peripheral portion of each resin island of the plurality of resin islands rises higher than the center portion thereof.

2. The micropattern transfer method according to claim 1, wherein the resin is a photo-curable resin, the micropattern transfer method further comprising the steps of:
    irradiating the resin with light in order to cure the resin with the stamper pressed against the resin; and
    peeling the stamper from the cured resin.

3. The micropattern transfer method according to claim 1, wherein
    a surface tension of the resin is equal to or less than 0.8 times a surface energy of the substrate, and
    a diameter of each resin island of the plurality of resin islands is equal to or less than 500 μm in plan view on the substrate.

4. The micropattern transfer method according to claim 1, wherein a diameter of each resin island of the plurality of resin islands is equal to or more than 300 μm in plan view, and a thickness of the center portion of each resin island of the plurality of resin islands is equal to or less than 30 nm.

5. The micropattern transfer method according to claim 1, wherein the resin covers 70% or more of the surface of the substrate.

6. The micropattern transfer method according to claim 1, wherein a height of the peripheral portion of each resin island of the plurality of resin islands is higher than a height of the center portion thereof.

7. A micropattern transfer method wherein a micropattern is transferred to a photo-curable resin by pressing a stamper having the micropattern onto the photo-curable resin applied to a substrate, comprising the steps of:
    applying the photo-curable resin to a surface of the substrate in order to obtain a plurality of photo-curable resin islands separated from each other, each photo-curable resin island of the plurality of photo-curable resin islands having a center portion and a peripheral portion, the center portion of each photo-curable resin island of the plurality of photo-curable resin islands forms a planar thin-film, and the peripheral portion of each photo-curable resin island of the plurality of photo-curable resin islands rises higher than the center portion thereof; and radiating light on the photo-curable resin in order to cure the photo-curable resin with the stamper pressed against the photo-curable resin;

wherein a surface tension of the photo-curable resin is equal to or less than 0.8 times a surface energy of the substrate, and a diameter of each photo-curable resin island of the plurality of photo-curable resin islands is equal to or more than 300 μm and is equal to or less than 500 μm in plan view.

8. The micropattern transfer method according to claim 7, the micropattern transfer method further comprising the step of:

peeling the stamper from the cured resin.

9. The micropattern transfer method according to claim 7, wherein a thickness of the center portion of each photo-curable resin island of the plurality of photo-curable resin islands is equal to or less than 30 nm.

10. The micropattern transfer method according to claim 7, wherein the photo-curable resin covers 70% or more of the surface of the substrate.

11. The micropattern transfer method according to claim 7, wherein a height of the peripheral portion of each photo-curable resin island of the plurality of photo-curable resin islands is higher than a height of the center portion thereof.

* * * * *